United States Patent [19]

Lavigna et al.

[11] 4,249,988
[45] Feb. 10, 1981

[54] GROWING CRYSTALS FROM A MELT BY CONTROLLING ADDITIONS OF MATERIAL THERETO

[75] Inventors: Robert J. Lavigna, Bath; Raymond E. Reusser, Bethlehem, both of Pa.

[73] Assignee: Western Electric Company, Inc., New York, N.Y.

[21] Appl. No.: 886,865

[22] Filed: Mar. 15, 1978

[51] Int. Cl.³ .................. C30B 5/02; C30B 15/04; C30B 29/06

[52] U.S. Cl. ............................ 156/605; 156/607; 156/617 SP; 156/DIG. 64; 156/DIG. 105; 148/172

[58] Field of Search ......... 156/600, 605, 607, 617 SP, 156/622, 624, DIG. 64, DIG. 105; 148/172, 173

[56] References Cited

U.S. PATENT DOCUMENTS

| | | | |
|---|---|---|---|
| 2,994,593 | 8/1961 | Sullivan | 156/624 |
| 3,679,370 | 7/1972 | Czeck et al. | 156/DIG. 63 |
| 3,899,304 | 8/1975 | Linares | 156/607 |
| 3,966,445 | 6/1976 | Adams | 156/622 |

OTHER PUBLICATIONS

"Apparatus for Injecting Controlled Amounts of Material into a Hot Crystal Grower," W. Elec. Tech. Dig.

Primary Examiner—Bradley Garris
Attorney, Agent, or Firm—D. C. Watson; G. W. Houseweart

[57] ABSTRACT

Specially selected particles 32 of an irregularly shaped material are almost completely melted in a heated crucible 22. Then while a small upper portion of the material 32 is still partially solid, additional but smaller particles 38 of a material are added thereon. Another method also starts with the specially selected particles 32 of a material which are completely melted in the heated crucible 22. Then the top surface of the liquid is partially frozen into a structural layer 36 to receive the addition of the smaller particles 38. Both techniques substantially prevent extremely hot liquid which is dangerously reactive from being scattered outside the crucible 22 when additional material 38 is added therein. Finally the entire contents of the crucible 22 are melted and a single-crystalline ingot 48 is grown from a melt 34.

14 Claims, 13 Drawing Figures

GROWING CRYSTALS FROM A MELT BY CONTROLLING ADDITIONS OF MATERIAL THERETO

BACKGROUND OF THE INVENTION

1. Field of the Invention

This invention relates to methods of growing crystals from a melt by controlling additions of material thereto. More particularly, this invention relates to Czochralski methods of growing single-crystalline ingots and to methods of preparing the molten material from which the crystals are grown. The invention further relates to efficient use of polycrystalline material to prepare the molten material. Also, the invention relates to the versatile formulation of such material to control the quality of the single-crystalline ingots grown in the process.

2. Prior Art

Conventional Method

It has been conventional to use the Czochralski method to grow a single-crystalline ingot from a polycrystalline material. This is done by first melting such material in a heated crucible to form a liquid. This liquid, called a melt, must be of a given quantity to grow a crystal of a desired mass.

A previously prepared seed crystal is then selected of the same crystalline material having the desired crystalline lattice orientation. This seed is contacted to the surface of the melt in the crucible and gradually withdrawn at a rate in the order of several centimeters per hour. Meanwhile, the seed ingot and the crucible holding the melt are counter-rotated with respect to each other.

Single-crystalline ingots, about a meter in length and several centimeters in diameter are grown by this method. This is routinely done in the semiconductor industry especially that sector of the industry manufacturing silicon based devices.

In this industry, it is convenient to introduce into the primary polycrystalline material, prior to meltdown or when it is a melt, an ingredient typically called a dopant. This ingredient can be a material such as phosphorous, antimony or arsenic for electrical reasons called an N-type dopant. It can also be a material such as boron, gallium or aluminum called a P-type dopant.

These dopants are introduced into the melt, or with the solid primary material, generally as granules of the elemental dopant material. They can also be introduced as alloys in combination with the primary material.

Raw Material Problems

In the crystal growing processes of the past, problems have arisen in efficiently using all available shapes of raw polycrystalline material made by the producers. The available silicon, called primary material, must be of high overall purity. This quality is achieved by producers of silicon generally using the standard Siemen's trichlorosilane reduction process. This process, familiar to those in the art, produces the silicon in rods of "U" type configuration. Efficient use of all parts of these rods causes many problems.

These problems result from a complex set of equipment and material factors. One factor is the design of the crucibles; these crucibles are made of high purity silicon dioxide in the form of fused silica, to avoid contaminating the melt with unmanageable impurities. The fused silica crucibles are brittle at ordinary temperatures and require careful treatment to avoid damage. Also, the crucibles are of standard sizes. Yet they must be filled with enough solid silicon to form a large mass of molten silicon when the melt is completed.

Care must be exercised to control the shifting and settling of the solid silicon due to expansion and gravity while it is being heated and formed into a liquid. Such movement of the solid silicon can cause breakout of crucibles, releasing extremely hot and dangerously reactive silicon which seriously damages chamber liners and other parts of the growing chamber.

In the prior art these problems were solved by using an individual cylinder of primary material to grow a single crystal of a desired mass. The cylinder was positioned vertically in a heated crucible for the melting operation. The height of the cylinder was tailored to produce the mass of melt needed to grow a given crystal. The cylinder was also tailored to allow a given peripheral space between the cylinder and the crucible for ease of insertion into the crucible, for shifting and settling during meltdown and to avoid stressing the crucible at the bottom radius adjacent to the side wall. This method usually produced a melt of a given mass without crucible breakout and consequent damage to equipment.

One disadvantage of this prior art technique was the restrictive use of raw materials as produced by the suppliers of silicon. Only the straight-leg parts of the "U" shaped rods could be used because of the geometries involved. And even these parts had to be carefully tailored to fit a given crucible to grow a crystal of a desired mass. Because of this restriction many different sizes of cylinders, unique to each demand, had to be carried in stock. Broken cylinders of primary silicon could not be used. Also, scrap material, even of high purity, could not be used efficiently.

The suppliers of the raw material were also at a disadvantage under the prior art. The bridge part of the "U" shaped rods could not be easily sold because this part could not be tailored into an acceptable cylinder. Much machine time and labor had to be used to tailor cylinders out of the leg parts of material to suit a given specification. Finally, the particles generated by the cylinder preparation, bridge particles and other miscellaneous scrap particles had to be recycled by the producers or wasted.

Operational Material Problems

Controlling the quality of material during the melting and growing operation is also a serious problem. This quality control problem is difficult because it is necessary to keep three types of materials in balance: (1) the primary material, (2) the desired dopant material, and (3) the foreign materials picked up from the equipment or the environment encountered by the primary material or the dopant.

Obtaining the correct dopant concentration in the ultimately grown single-crystalline ingot is the main operational material problem. Dopant concentration affects resistivity of the crystalline ingot and hence, the resistivity of the wafers cut from the ingot.

Control of electrical resistivity is important to many later uses of the wafers. It is required to develop electrically isolated areas in wafers used to make integrated circuits. It has an effect on the depth to which other, different dopants may later be diffused into the wafers. And it affects the concentration gradients of such diffused dopants. Also, certain wafers used in devices require narrow ranges of resistivity which are difficult to achieve.

To obtain a desired resistivity, it is conventional to add a known amount of dopant to the primary material in the crucible before either material is melted. Most dopants tend to evaporate, especially during the initial meltdown of the materials. These dopants also evaporate from the melt while the crystalline ingot is being grown, a process requiring many hours. Finally, the rate of evaporation is difficult to predict because it depends in complex ways upon concentration of dopant, temperature gradients in the materials and upon process ambient conditions.

It is well known that, as some liquid materials freeze, trace impurities tend to segregate toward the remaining liquid portion of the mass. This is especially true in growing crystals. As the crystal is grown the dopant becomes incorporated into the freezing crystalline ingot in complex ways depending upon the crystalline lattice structure, upon the dopant being used and upon growing process details. The dopant in each increment of ingot being grown at any instant is proportional to the dopant concentration in the melt. But it is generally somewhat less than the concentration in the melt for silicon work.

Melt volume is continually depleting as material is pulled out as a crystal. So dopant generally builds up in the depleting melt. And each succeeding increment of crystal grown is generally higher and higher in dopant concentration. This segregation continues until the melt is depleted or until growth must be stopped because the dopant concentration will be higher in the crystal increment about to be grown than the specification will bear.

Other problems plague the art. Equipment, environment and many other factors can cause excessive crystalline dislocations. Such dislocations compel premature ingot termination. This premature termination, compelled by generation of excessive dislocations in the growing crystal, can happen at any stage of crystal growth. If it happens early in the operation, the grown crystal is re-melted and a completely new start is made. If it occurs after many hours of growing then the crystal is removed and an original seed portion is contacted to the same melt to continue the production.

SUMMARY OF THE INVENTION

Accordingly, it is an object of this invention to provide new and improved methods of growing crystals from a melt by making controlled additions of material to the melt.

In one embodiment of the invention, a material (referred to herein as a second material) is heated under selected ambient conditions until it is almost completely formed into a liquid. Then, the ambient conditions are varied so that the liquefying process stops when the lower portion of the second material is liquefied but before all of the upper portion of the second material becomes liquefied.

Another material, (referred to herein as a first material) is then added onto the upper portion of the second material. This method substantially prevents the added first material from contacting the liquid to prevent the liquid from being scattered.

Next, the ambient conditions are again varied to liquefy the added first material and all of the upper portion of the second material. This method increases the liquid volume to a desired mass. Then a single-crystalline seed ingot is contacted to the liquid. And the seed ingot is withdrawn thereby growing a single-crystalline ingot of a desired mass.

Another embodiment of the invention includes heating the second material under selected ambient conditions until it is completely formed into a liquid. Next, the ambient conditions are varied so that a top layer of the liquid forms a partially solidified structural layer capable of supporting additional material. Then a first material is added thereon. Again, all material is completely liquefied and a crystal is grown as in the first embodiment.

Both methods permit use of less costly, irregularly shaped material with many other advantages. Material acquisition time is reduced; highly reactive molten material is not scattered about the growing chamber; crucibles are not damaged by shifting and settling of the solid material due to expansion and gravity as the material is melted; larger crystals can be grown; melts can be easily reconstituted and quality control is improved. Finally, all this is achieved without special handling, without increased operator time and without increased power consumption.

BRIEF DESCRIPTION OF THE DRAWING

The foregoing and other objects and features of the invention may be better understood from the following detailed description and drawing, wherein.

DETAILED DESCRIPTION

For illustration, the invention will be described principally in connection with a conventional Czochralski-type crystal growing machine. More detail on construction and operation of this type of crystal grower is described in U.S. Pat. No. 3,697,370, issued July 25, 1972, to J. J. Czeck et al., and assigned to the assignee of record. One type of grower is that sold by Siltec Corp., Menlo Park, Calif., under the trade designation "Model 860." This unit is often used for growing single-crystalline ingots of silicon.

These ingots are typically grown from a melt of polycrystalline silicon called the primary material. The melt may or may not contain a dopant material depending upon the specifications desired in the ultimately grown crystal.

Figure 1:
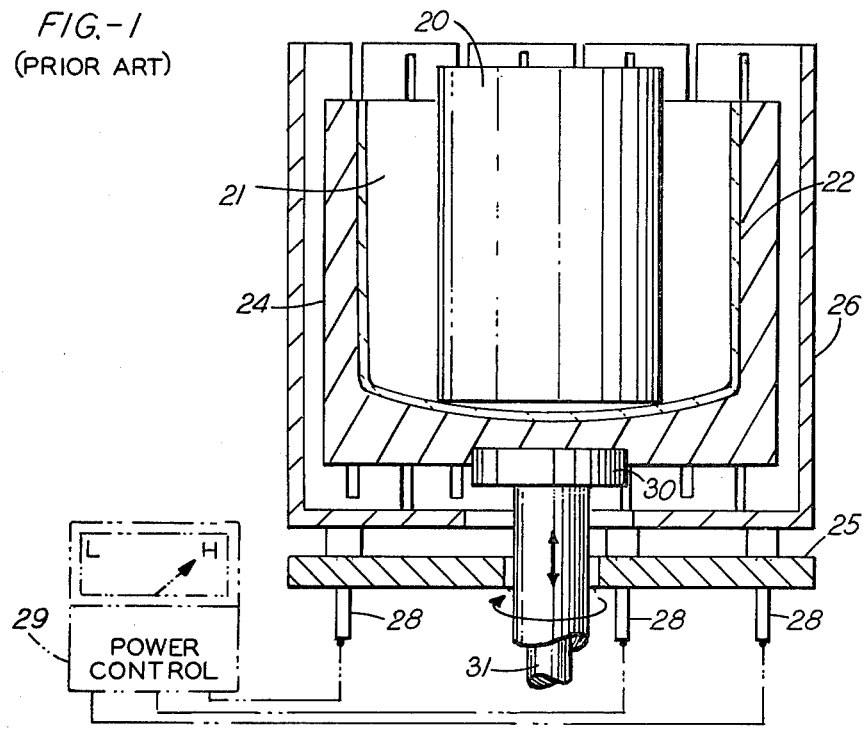
FIG. 1 is a front elevation view, partly in section, of the central region of a conventional crystal grower, showing a crucible, a heater and an individual cylinder of primary material, to illustrate the prior art method of filling the crucible.

Referring now to FIG. 1, a central region of a conventional crystal grower is shown. The grower includes a crucible 22 held within a black body housing 24 typically made of graphite. For historical reasons this housing 24 is referred to in the art as a "susceptor" and that term will be used hereinafter.

Resistance heating is now used and a heating element 26 is provided for this purpose. This heating element 26 is connected to a power source (not shown) through water cooled electrodes 28. A power control 29 allows the power consumed by heating element 26 to be varied from zero to about 50KW.

The heating elements 26 rests on graphite blocks (not shown) which connect to the electrodes 28. These electrodes are in turn insulated from the base of the growing chamber (not shown). A pedestal 30 supports the susceptor 24 and, in turn, is supported by a crucible rotating shaft 31. This shaft 31 is supported by means (not shown) so that the shaft 31, the susceptor 24 and the crucible 22 can be easily raised or lowered within heating element 26.

Ambient conditions within the crucible 22 must be controlled for various reasons. First the melting point for polycrystalline material such as silicon is 1420° C. Thus to melt a reasonable mass of the material within a tolerable time requires temperatures at heating element 26 in the range of from about 1600° to about 1800° C. But the heat zone provided by heating element 26 is limited in vertical dimension. So it is useful to vary the vertical position of the crucible 22 within heating element 26. This is done to accommodate different requirements of each step of the process; e.g., meltdown, freezeover, growing, meltback, etc.

Ambient condition control is necessary also for oxidation reasons. At these high temperatures oxygen reacts very aggressively and combines with molten polycrystalline silicon to cause deleterious contamination. To miminize this oxidation, ambient gas control means (not shown), are used to flood the chamber with an inert gas. The gas, typically highly pure argon, is chosen for its inertness, its purity and its heat conductance properties. And the flow can be controlled to suit each step in the operations.

The crucible 22 is advantageously formed of highly pure, fused silica material, chemically known as silicon dioxide. This material is chosen in silicon work because it is compatible with polycrystalline silicon. The fused silica generally donates only known, manageable impurities into the melt. But a disadvantage of the crucible 22, formed of this material, is that it is very brittle at normal temperatures and does not easily withstand impact and uneven forces which can occur during handling, loading and meltdown of the silicon.

An individual cylinder 20 of polycrystalline silicon, called primary material, is shown in FIG. 1 positioned within the crucible 22 ready to be melted down, in accordance with prior art techniques. The height of the cylinder 20 is tailored to provide a given mass of primary material when it is melted completely. The height of the cylinder must be taken with its diameter to get the required mass. And the diameter of the cylinder 20 is fixed by considerations which follow.

The diameter of the cylinder 20 has been carefully tailored to allow a peripheral space 21 between the cylinder 20 and the crucible 22. This space 21 is provided for ease of inserting the cylinder into the crucible, to accommodate the shifting and settling of the solid silicon during meltdown and to avoid stressing the crucible at its bottom radius adjacent to the side wall of the crucible. Otherwise the uneven forces will weaken and possibly crack the crucible 22 and destroy the susceptor 24. When this crucible break-out occurs molten material of extremely high temperature (in the order of about 1600° C.) is generally released into the growing chamber. This problem can be further understood by reference to U.S. Pat. No. 3,698,872 issued Oct. 17, 1972, to R. E. Reusser, assigned to the assignee of record.

Damage which is caused by crucible break-out is particularly costly. Crucibles and susceptors are lost. Heaters can become damaged or completely ruined. Also chamber liners and other items are similarly damaged. This effect explains why those people who are skilled in the art have adopted the individual cylinder 20 method of filling the crucible 22.

The material for the individual cylinder 20, known to those in the art as a "one-piece charge," is specified for silicon with a large degree of particularity. The chemical requirements ask that the maximum average bulk boron level not exceed 1.0 part per billion parts by atomic weight (1.0 PPB). This same parameter for presence of electron donors such as phosphorus may not exceed 2.0 PPB. The surface must be suitably etched by mixed acids and/or otherwise cleaned to protect the given chemistry.

The physical requirements are also closely specified. For a typical individual cylinder weighing nominally 6.5 kilograms, the diameter must typically measure between 138 m.m. and 180 m.m. and the height must measure between 107 m.m. and 183 m.m. The mass or weight tolerance is 1.5%. And the ends must be cut squarely so that at least one end is cut at an angle of 90±5 degrees with respect to the axial centerline of the cylinder. Chips may be cut off one end only and may not involve more than 15% of the end area.

Polycrystalline materials are susceptible to build-up of internal stresses during production of the the material. These stresses are particularly evident in the larger, heavy cylinders. Such cylinders can explode during meltdown causing serious damage. So residual stresses are carefully limited as are fissures, cracks, voids and surface blisters, each having limiting parameters in the specifications. All these factors explain the high cost of the prior art method and the problems to be expected as future operations continue to scale upward the dimensions of these cylinders.

Figure 2:
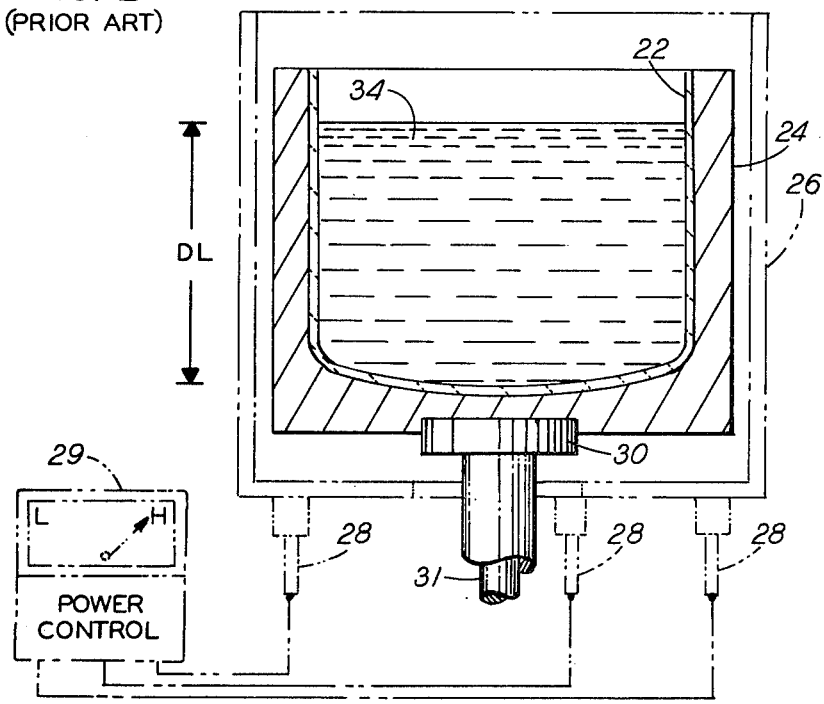
FIG. 2 shows the same crystal grower region as FIG. 1, but with a heater illustrated schematically and with the primary material formed into the desired level of melt "DL" needed to grow a given crystal.

The individual cylinder 20 when fully melted provides the desired level "DL" of melt shown in FIG. 2. It should be noted in both FIG. 1 and FIG. 2 that the power control 29 is set to draw about 50 KW during the melt down. This melt down of a cylinder weighing about 6.5 kilograms is done over a period of about 90 minutes to preserve dopant and to minimize oxidation of the melt.

It will also be appreciated that other heating means and power control means could adequately perform the function of heating element 26 and of power control source 29.

Figure 3:
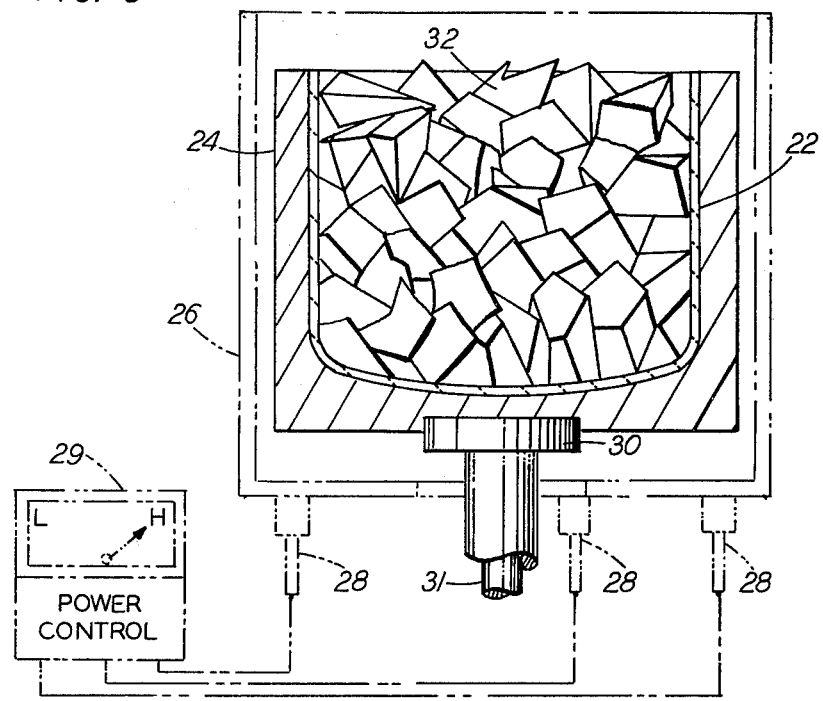
FIG. 3 shows the same grower region with the crucible filled with large-size particles of a second material having irregular shape in accordance with the present invention.

Referring now to FIG. 3, the same grower region of FIG. 2 is shown except that the crucible 22 is filled with a material critical to this invention. This material comprises specially selected particles 32 of a second material, in this case polycrystalline silicon. The weight of the lot of particles is about 70% to 95% of the weight of the total material required. These particles are of irregular shape and range in size from about 4 millimeters to about 125 millimeters in cross-sectional dimension at the largest section of each particle. Also the particle sizes are graded so that from about 40% to about 60% by weight of the lot will be less than 60 millimeters in cross-section dimension. This specification on particle size has been found necessary for many reasons.

First, if too many particles under 60 m.m. in the specification are used there is a great risk that they will shift or settle and become packed in the crucible 22. Then when the particles are heated to form a melt, there will be insufficient air space for further shifting and settling due to expansion and gravity and crucible break-out will occur.

Secondly, if too many particles over 60 m.m. in the specification are used, there will be insufficient melt formed on first meltdown to complete melt preparation with just one more addition. Of course, it would be theoretically possible to accept all particles from 60 m.m. to 125 m.m for the second material. But then, to obtain the required mass of material in the crucible, the particles would have to be fitted together like a three-dimensional jigsaw puzzle. And this would require an impractical amount of time and effort.

Figure 4:
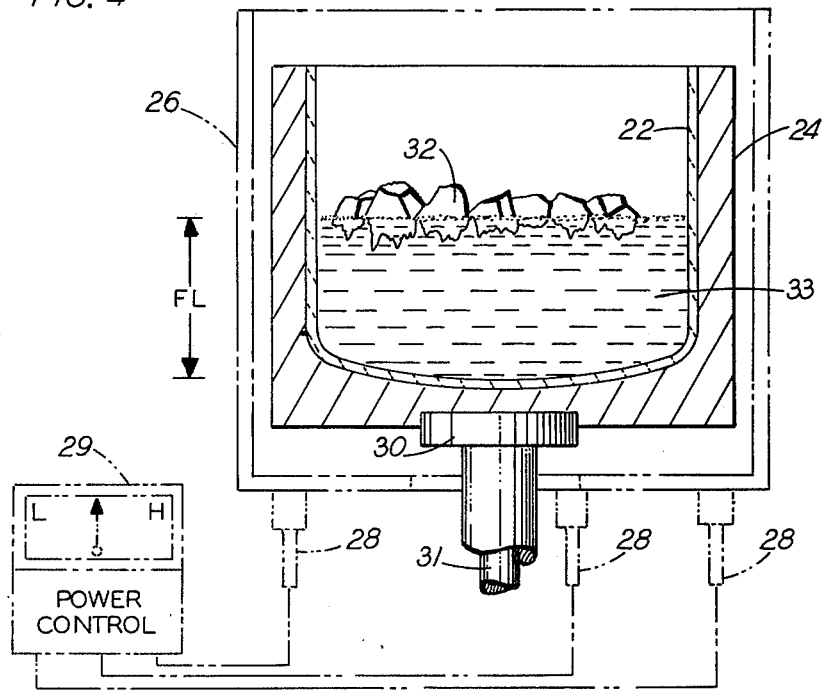
FIG. 4 shows the same grower region with the large-size particles of FIG. 3 almost completely formed into a melt in accordance with a first embodiment of the invention.

This second material 22 is partially melted down to the condition shown in FIG. 4. This typically takes about 55 minutes. At this point from about 80% to about 90% of the second material typically has been melted. The power control 29 is then reduced to draw about 30 KW to stop further melting within the crucible 22. Some formation of fine crystals attached to the large-size particles 32 will take place; this condition provides support for the addition of more material.

Figure 5:
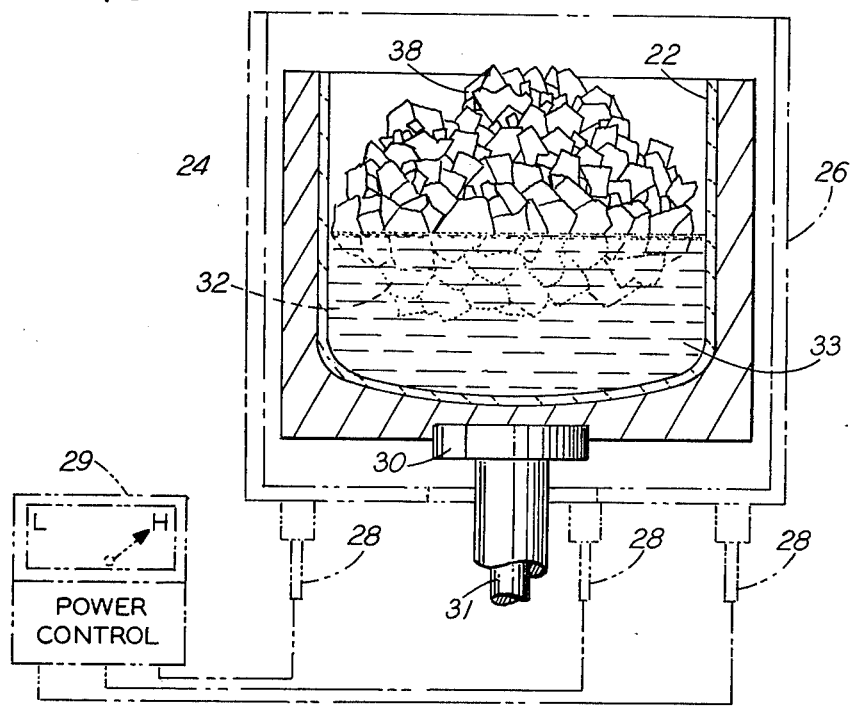
FIG. 5 shows the same grower region with small-size particles of a first material having irregular shape added onto the, almost completely melted, large-size particles of FIG. 4.

FIG. 5 shows the same view as FIG. 4 with smaller particles 38 added onto the partially melted layer of floating second material. This layer is effective to accept the controlled addition of the first material without intolerable scattering of molten material outside the crucible.

The added material, referred to for convenience as a first material, is specified with some degree of particularity. The particle size ranges from about 4 m.m. to about 26 m.m. in cross-sectional dimension at the largest section of each particle. The sizes in each lot are found to be typically graded in accordance with the following sieve analysis and limits:

| Sieve Size | | | Typical Distribution (% Retained by Weight) | Material Specification (% Retained by Weight) |
| --- | --- | --- | --- | --- |
| No. | Metric | U.S. | | |
| #1 | 25.4 m.m. | 1 inch | Essentially 0% | 75% minimum |
| #¾ | 19.0 m.m. | ¾ inch | 18 to 29.5% | 12.7 to 25.4 m.m. |
| #½ | 12.7 m.m. | ½ inch | 71.5 to 84% | |
| #5/16 | 8.00 m.m. | 5/16 inch | 95.5 to 98% | 25% maximum |
| #8 | 4.00 m.m. | ⅛ inch | Essentially 100% | 4.0 to 12.7 m.m. |

This gradation of the first material is necessary for somewhat different reasons than for the second material. The gradations from 4 m.m. to 12.7 m.m. have to be kept from exceeding 25% of the total because a preponderance of them would represent a large quantity of surface area of silicon exposed to oxidation. Yet it is difficult and expensive to eliminate them entirely from the specification. They are innately a part of the crushing process. But particles finer than 4 m.m. must be essentially eliminated because they stick onto the crucible wall thus causing operating problems.

On the other hand, particles above 25.4 m.m. must be eliminated because they cause problems with the tool used to add the first material. This tool (not shown) was disclosed by F. E. Christman in the Western Electric *technical digest* No. 39, page 15, dated July 1975. The tool has a delivery tube with a diameter of about 100 m.m. And particles larger than 25.4 m.m. tend to bridge and hang up in the tube. Thus the specification for this first material has been developed as a cost effective compromise of supplier and growing operation problems.

Both the first and the second materials in silicon work must conform to the chemical requirements of the prior art material. But they do not have to conform to the same extensive physical requirements outlined previously for the prior art individual cylinders.

Figure 6:
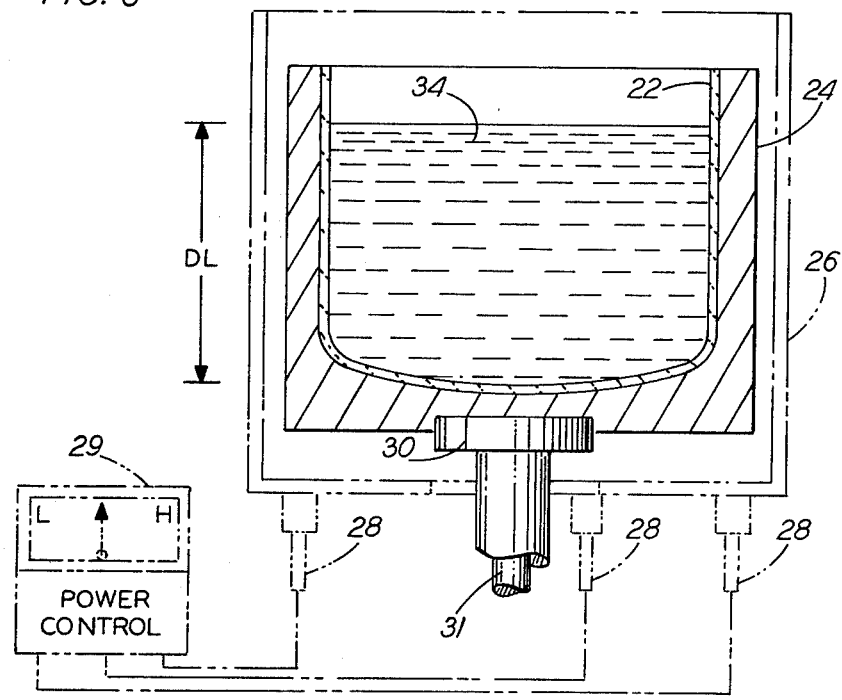
FIG. 6 shows the same grower region with all of the both-size particles of FIG. 5 formed into the desired level of melt "DL" shown in FIG. 2.

The quantity of the first material 38, added onto the almost completely liquefied second material 32, typically ranges from about 15 to about 30% of the total material required to make the melt. After the first material 38 is added the power control 29 is again reset to draw about 50 KW and all materials are formed into a melt 34 of desired level "DL" as shown in FIG. 6.

Figure 7:
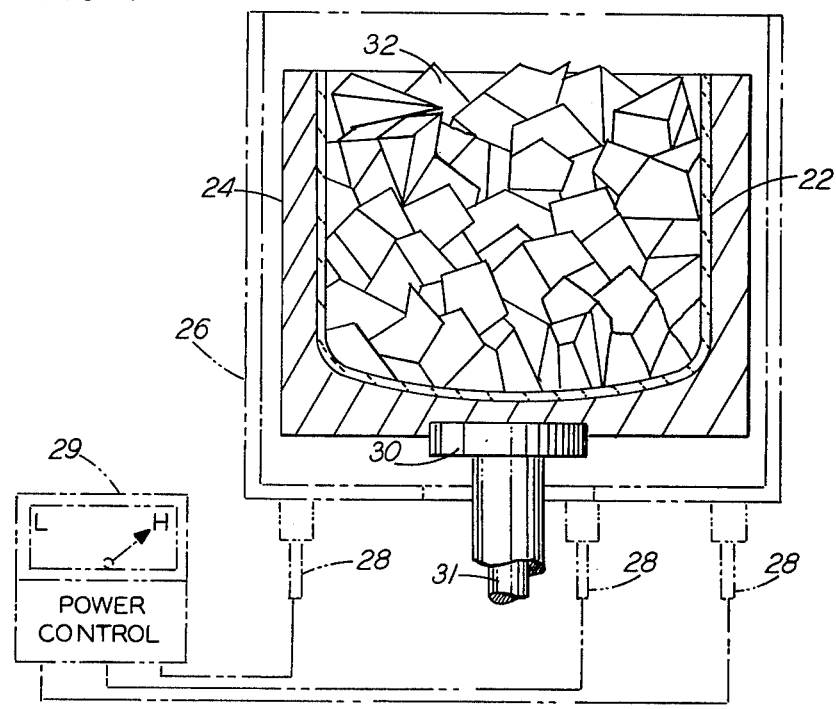
FIG. 7 shows the same grower region with the crucible filled with large-size particles of a second material as in FIG. 3.

An alternate embodiment of the invention is started in the same way as the other embodiment. The first step is shown in FIG. 7 with the second material 32 placed within the crucible 22, ready for meltdown.

Figure 8:
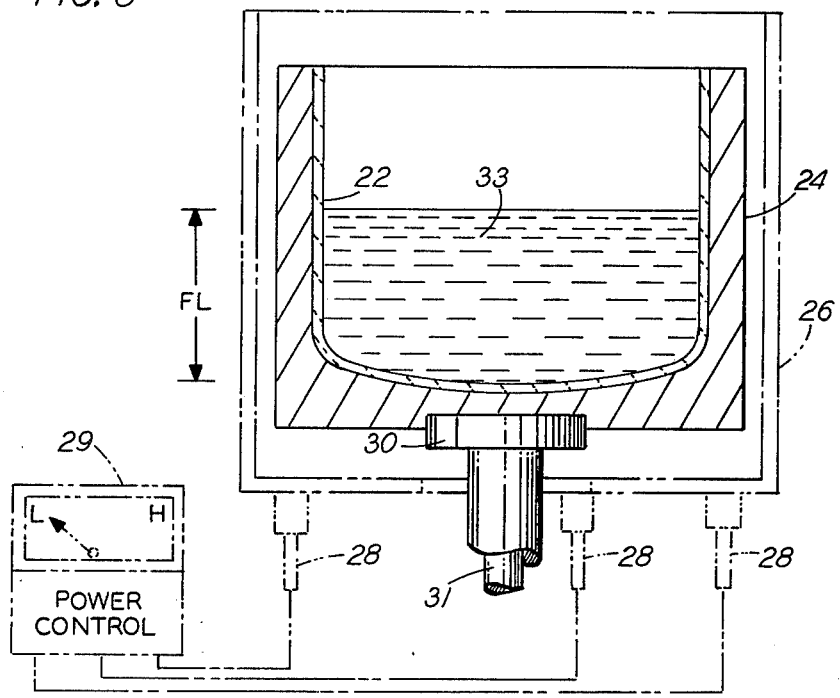
FIG. 8 shows the same grower region with the particles of FIG. 7 formed into a first level of melt "FL"

Referring now to FIG. 8, the same grower region is shown with the large size particles 32 of primary material formed into a first melt 33 of level "FL". This meltdown of the second material to a complete liquid takes about 60 minutes with the power control 29 set to draw full power of about 50 KW.

Figure 9:
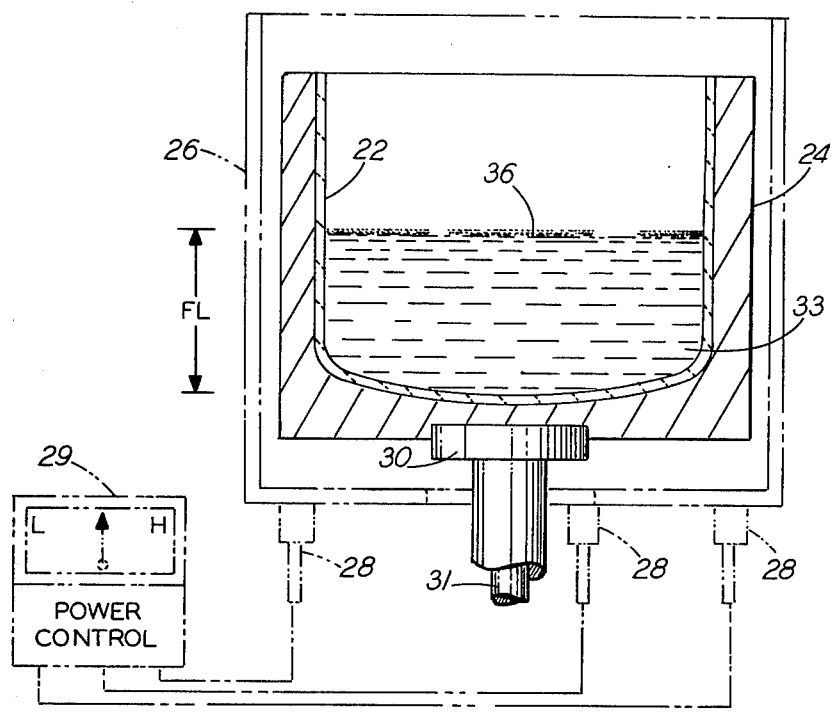
FIG. 9 shows the same grower region with a structural layer formed on the surface of the first level of melt of FIG. 8 in accordance with an alternate embodiment of the invention.

Next, in FIG. 9, the same grower region is shown and the same first melt 33 is shown as in FIG. 8. Only now the power control has been first reset to draw about 20 KW. As a result, the melt surface has cooled and a structural layer 36 has been formed. This layer is comprised of fine crystals on the surface of the first melt 33. Openings (not shown) are allowed to remain in the layer 36 which allow expansive relief as such layer 36 forms. The power control 29 is reduced for from 5 to 10 minutes until the layer 36 is about 0.125 inches thick. The power control is then reset as shown to draw about 30 KW to stop the formation. The layer 36 is then capable of supporting additional particles of material thereon.

Figure 10:
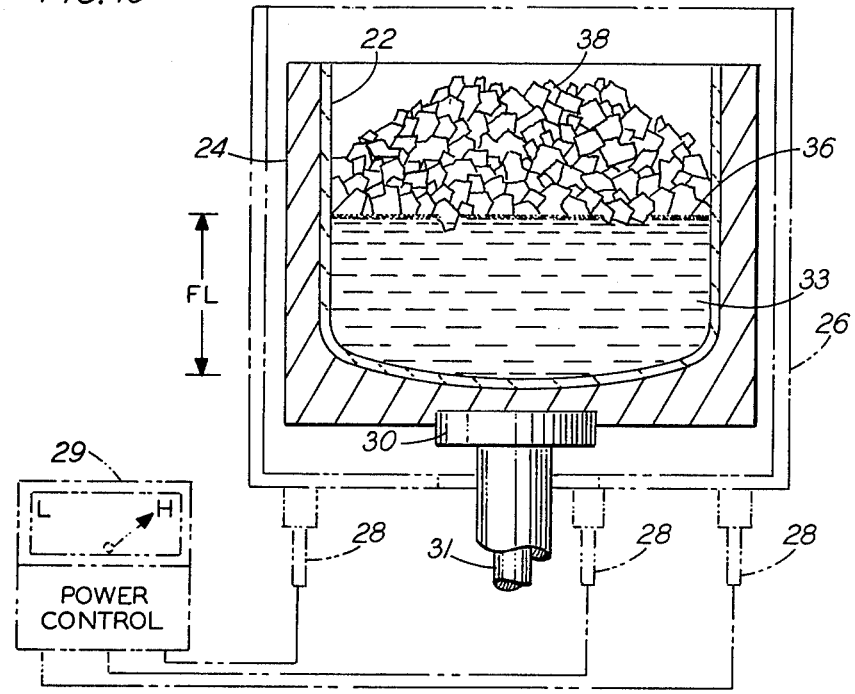
FIG. 10 shows the same grower region with small-size particles of a first material added onto the structural layer of FIG. 9.

In FIG. 10 the same grower area is shown with additional particles of a first material added onto the structural layer 36 previously formed. This layer is also substantially effective to accept the controlled addition of the first material without scattering molten material outside the crucible.

Figure 11:
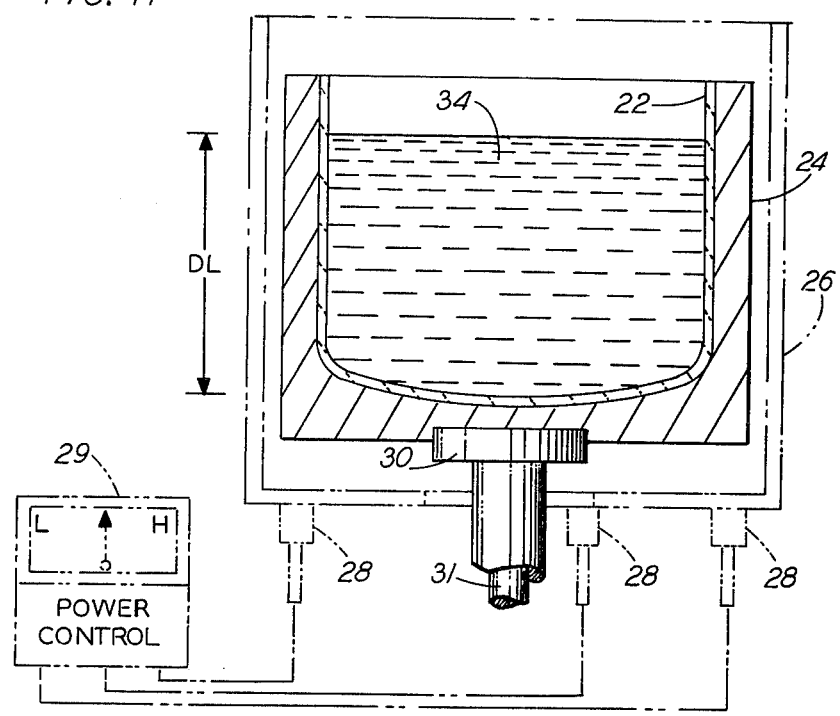
FIG. 11 shows the same region with the small-size particles and the structural layer formed into the same desired level of melt "DL" shown in FIG. 2.

As before, the quantity of the added first material 38 ranges from about 15 to 30% of the total material required to make the melt 34. After this first material 38 is added the power control 29 is again reset to draw about 50 KW. Then all the contents of crucible 22 are formed into a melt 34 of desired level "DL" as shown in FIG. 11.

Figure 12:
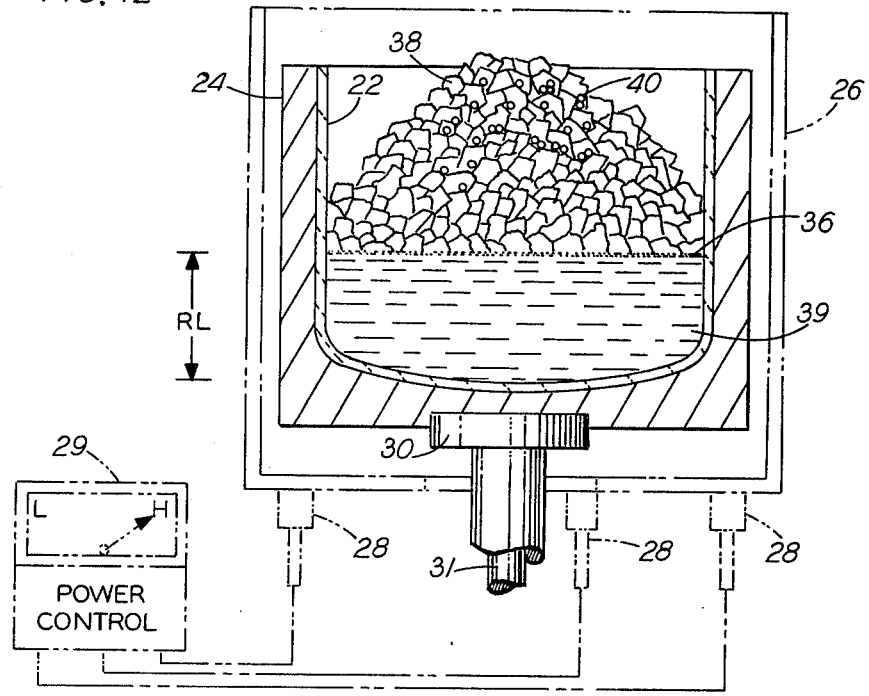
FIG. 12 shows the same grower region with a random level of melt "RL" left by premature ingot termination, with a structural layer formed as shown in FIG. 9, with small-size particles of a first material added onto the structural layer and with dopant granules added with the additional first material.

Referring now to FIG. 12, the same grower region is shown illustrating use of the invention for three functions important in the crystal growing art. They are as follows:

1. Additions after premature ingot termination.
2. Additions of material to be recycled.
3. Additions for growing crystals requiring "window" resistivity.

Sometimes semiconductor requirements call for a crystal of less than full length of a certain diameter of crystal being grown. It is then desirable to make use of the remaining melt to grow a different diameter full length crystal. Also, there are times during a production run when a partially grown crystal starts to develop excessive dislocations in its single-crystalline lattice structure. If this occurs when the melt is nearly depleted the production run is stopped and a completely new start is made. However, when excessive dislocations occur early in the production run, it is uneconomical to waste the melt remaining. A new crystal can be started using the melt remaining or the melt can be reconstituted.

To reconstitute such a random size melt 39 of a random level "RL", a structural layer 36 is first formed by resetting the power control 29 to draw 20 KW until the layer 36 forms then raising the power to draw 30 KW as previously explained. Then the first material 38 of primary material with or without dopant granules 40 can be added onto the layer 36. All the contents of crucible 22 are then melted as previously described.

The same FIG. 12 can be used to explain additions made to a melt for material recycling. This function is most aptly applied to the efficient use of crystalline material which heretofore has often been scrapped. Scrap materials such as those containing very low concentrations of boron dopant material are used as a second material and are first formed into a random melt 39. Then while all the contents of crucible 22 are liquid, a small sample is withdrawn and analyzed. This technique is being introduced into the art as "Real-Time Analysis and Control." It is taught in greater detail in U.S. Pat. No. 4,134,785 by Lavigna et al., assigned to the assignee of record.

After analysis of the melt 39 is completed, a formulation is calculated to properly constitute the melt 39. For example, when very low boron doped material is used to start the melt, the added material is formulated for silicon requiring a different concentration of boron.

Then a structural layer 36 is formed as described before and the first material 38 containing material with or without dopant granules 40 are added thereon. The contents of crucible 22 are again melted as before and a melt of known chemistry and of a desired mass is ready to grow a given crystal.

In this process a wide range of materials can be reprocessed. These materials can be crushed and graded so as to conform to the critical gradations of either the first or of the second material.

"Window" resistivity silicon crystals are of special concern to those people skilled in the art. These crystals must be grown with special chemistry so that the resistivity of the crystal falls between an upper and a lower limit. These limits are obtained by using this invention in either embodiment. First, the technique is used to prepare an initial melt having just enough dopant to start a crystal having the resistivity characteristic at the high limit desired. As the crystal is then grown primary material is formed into the crystal with greater and greater concentration of dopant. This is because generally the dopant tends to segregate from the solidifying material and favor retention in the melt which is being depleted.

Growth of the "window" resistivity crystal continues until the increment of crystal being grown at a particular instant in time gets to the low resistivity limit. At about that instant, based on experience, the growth is discontinued. The remaining melt 39 in FIG. 12 is then reconstituted by complex measurements and calculations based in part on the mass of material removed by the growth operation. Then, using this method a first material 38 is added onto the structural layer 36. Last, the contents of crucible 22 are entirely melted down and a new crystal is grown again with the resistivity characteristic at or near the high limit.

Figure 13:
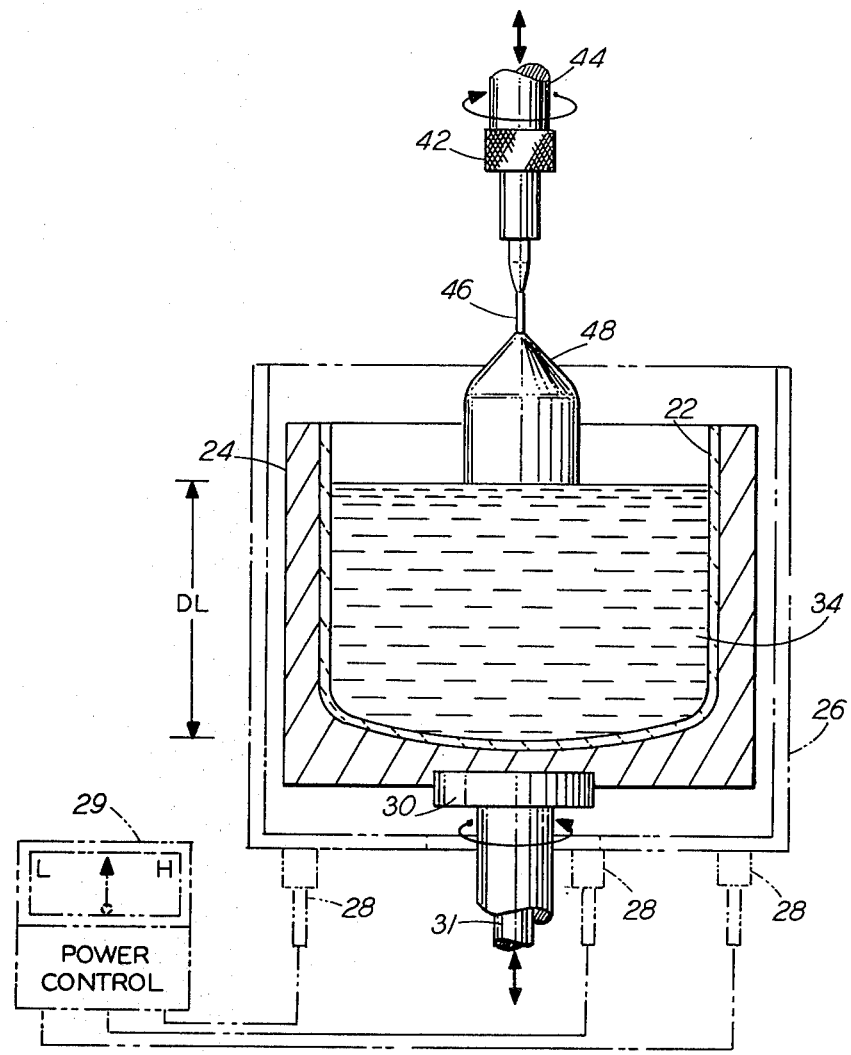
FIG. 13 shows the same grower region with a random level of melt shown, with a seed holding shaft shown and with a single-crystalline ingot in the process of being grown from the melt.

Referring then to FIG. 13, the same grower region is shown as before. The crucible 22 is held within the susceptor 24 which is held by the pedestal 30. And the heating element 26 is again shown as in the other figures. The power control 29, connected to the heater electrodes 28, is similarly shown. Shown also is the pedestal 30 held by the crucible rotating shaft 21. A crucible shaft rotating means (not shown) rotates typically at about 10 RPM. Also, a seed shaft 44 is shown located above the melt 34 about the centerline of the crucible 22. A chuck 42 affixed to the seed shaft 44 grips a seed ingot 46. A seed shaft rotating means (not shown) rotates the seed shaft in a direction opposite to that of the crucible and at a speed typically of 20 RPM. A crystal 48 is shown forming out of the melt 34 at a rate typically of about 5 to 15 centimeters per hour.

There have been illustrated herein practical embodiments of the invention and various applications thereof. Nevertheless, it is to be understood that various modifications and refinements may be used which depart from these disclosed embodiments. And these may be used without departing from the spirit and scope of the present invention.

What is claimed is:

1. A method of growing a single-crystalline silicon ingot using controlled additions of a first material to a second material, comprising:

heating a plurality of solid particles of the second material under selected ambient conditions in a crucible to partially form them into a liquid, the sizes of the particles being selected so that no more than 60% of the plurality are less than 60 millimeters in cross-sectional dimension to allow space for shifting and settling of the particles within the crucible due to thermal expansion and gravity so that the crucible is not stressed to a condition of rupture as the particles are heated and partially formed into a liquid;

varying the ambient conditions so that the liquefying process stops when the lower portion of the second material is liquefied but before all of the upper portion of the same material becomes liquefied;

adding at least one solid particle of the first material onto the upper portion of the second material to substantially prevent such solid particle of the first material from contacting the liquid of the second material to prevent such liquid from being scattered;

varying the ambient conditions to liquefy the added first material and the upper portion of the second material to increase the liquid volume; and contacting a single crystalline seed ingot to the liquid and withdrawing the seed to grow a single crystalline ingot.

2. A method as set forth in claim 1, wherein the first material is the same as the second material and both materials are polycrystalline.

3. A method as set forth in claim 1, wherein the materials are of the polycrystalline type used in semiconductors.

4. A method as set forth in claim 1, wherein at least one of the materials contains a dopant material for semiconductors.

5. A method of growing a single-crystalline silicon ingot using controlled additions of a first material to a second material, comprising:

heating a plurality of solid particles of the second material under selected ambient conditions in a crucible to completely form them into a liquid, the sizes of the particles being selected to range from about 4 millimeters minimum to about 125 millimeters maximum in cross-sectional dimension and no more than 60% of such plurality being less than 60 millimeters in cross-sectional dimension, said particle size permitting space for shifting and settling of the particles within the crucible due to thermal expansion and gravity so that the crucible is not stressed to a condition of rupture as the particles are heated and formed into a liquid;

varying the ambient conditions so that a top layer of the liquid forms at least a partially solidified structural layer of the second material with openings remaining which allow expansive relief as such structural layer forms, the structural layer being capable of supporting at least one additional solid particle of the first material;

adding at least one solid particle of the first material onto the structural layer to substantially prevent such solid particle of the first material from contacting the liquid of the second material to prevent such liquid from being scattered;

varying the ambient conditions to liquefy the added first material and the structural layer to increase the liquid volume; and contacting a single crystalline seed ingot to the liquid and withdrawing the seed to grow a single-crystalline ingot.

6. A method of growing a single-crystalline silicon ingot of a desired mass from a polycrystalline material, comprising:

selecting solid particles of a polycrystalline material sized in the range of from about 4 millimeters minimum to about 125 millimeters maximum in cross-sectional dimension and no more than 60 % of such particles being less than 60 millimeters in cross-sectional dimension;

heating the solid particles of the polycrystalline material in a crucible of a crystal grower under selected ambient conditions to form such material partially into a liquid;

varying the ambient conditions within the crystal grower so that the liquefying stops when the lower portion of the polycrystalline material in the crucible is liquefied but before all of the upper portion of the polycrystalline material becomes liquefied;

depositing onto the upper portion of the polycrystalline material in the crucible, solid particles of additional polycrystalline material to substantially prevent such solid particles from falling into the liquid to prevent the liquid from being scattered outside the crucible;

varying the ambient conditions within the crystal grower to liquefy all of the solid particles of the polycrystalline material to increase the liquid volume to the desired quantity; and contacting a single crystalline seed ingot of a desired crystalline lattice orientation to the liquid in the crucible and withdrawing the seed to grow a single-crystalline ingot of a desired mass.

7. A method as set forth in claim 6, wherein the solid particles of polycrystalline material used are silicon particles of irregular shape selected to allow space for shifting and settling of the particles within the crucible due to thermal expansion and gravity so that the crucible is not stressed to a condition of rupture as the particles are heated and formed into a liquid.

8. A method as set forth in claim 6, wherein the crucible used is made of fused silica.

9. A method as set forth in claim 8, wherein the crucible is of a predetermined size.

10. A method as set forth in claim 6, wherein more than one controlled addition of solid material is made to a partially liquefied material.

11. A method of growing a single-crystalline silicon ingot of a desired mass from a required mass of molten polycrystalline silicon material using a Czochralski crystal grower, comprising:

heating an initial plurality of solid, polycrystalline silicon particles under selected ambient conditions in a crucible of a Czochralski crystal grower, the particles being selected of irregular shape, sized between about 4 millimeters minimum to about 125 millimeters maximum in cross-sectional dimension at the largest section of each particle, graded so that not more than 60 % of the plurality are less than 60 millimeters in cross-sectional dimension, the plurality amounting to from about 70% to about 95% of the final required mass;

varying the ambient conditions within the crucible of the grower to raise the temperature of the solid polycrystalline silicon particles above the melting point for silicon and holding that temperature until all but about 15% of the particles are fully melted into a homogeneous liquid;

depositing another plurality of solid polycrystalline silicon particles within the crucible, upon the initial particles which are still solid, to substantially prevent the added plurality of solid particles from contacting the liquid, to prevent such liquid from being scattered about the chamber of the crystal grower, the other particles being selected with a size limitation of between about 4 millimeters minimum to about 25.4 millimeters maximum in cross-sectional dimension at the largest section of each particle, graded so that not more than 25%, by weight, of the particles are from about 4 millimeters to about 12.7 millimeters in size;

varying the ambient conditions within the crucible to raise the temperature of all the material above the melting point for silicon and holding it there for about 15 minutes to melt all the material to increase the liquid volume to the desired mass; and contacting a single-crystalline seed ingot of a desired crystalline lattice orientation to the molten silicon in the crucible and withdrawing the seed to grow a single-crystalline ingot of a desired mass.

12. A method as set forth in claim 11, wherein more than one controlled addition of solid polycrystalline silicon particles is made to a quantity of molten polycrystalline silicon material to grow a single-crystalline silicon ingot of a desired mass.

13. A method of growing a single-crystalline silicon ingot, comprising:

melting a plurality of silicon particles under selected ambient conditions in a crucible, the particles being sized between about 4 millimeters minimum to about 125 millimeters maximum in cross-sectional dimension at the largest section of each particle, graded so that not more than 60% of the plurality is less than 60 millimeters in cross-sectional dimension; and contacting a single-crystalline seed to the melted silicon and withdrawing the seed to grow a single-crystalline silicon ingot.

14. In a method of growing a single-crystalline ingot wherein a silicon material is melted in a crucible and a single-crystalline seed is contacted to the melted silicon and withdrawn to grow a single-crystalline ingot, the improvement comprising:

selecting a plurality of silicon particles for the silicon material sized in the range of from about 4 millimeters minimum to about 125 millimeters maximum in cross-sectional dimension at the largest section of each particle and graded so that not more than 60% of the plurality is less than 60 millimeters in cross-sectional dimension.

* * * * *